United States Patent
Jen

(10) Patent No.: US 10,600,568 B2
(45) Date of Patent: Mar. 24, 2020

(54) CAPACITOR AND METHOD OF FABRICATING THE SAME

(71) Applicant: United Microelectronics Corp., Hsinchu (TW)

(72) Inventor: Po-Han Jen, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 15/619,108

(22) Filed: Jun. 9, 2017

(65) Prior Publication Data

US 2018/0337000 A1    Nov. 22, 2018

(30) Foreign Application Priority Data

May 22, 2017    (CN) .......................... 2017 1 0364072

(51) Int. Cl.
| | |
|---|---|
| *H01G 4/06* | (2006.01) |
| *H01G 4/005* | (2006.01) |
| *H01L 23/522* | (2006.01) |
| *H01G 4/012* | (2006.01) |
| *H01L 49/02* | (2006.01) |
| *H01G 4/12* | (2006.01) |
| *H01G 4/08* | (2006.01) |
| *H01G 4/33* | (2006.01) |

(52) U.S. Cl.
CPC .............. *H01G 4/06* (2013.01); *H01G 4/005* (2013.01); *H01G 4/012* (2013.01); *H01G 4/08* (2013.01); *H01G 4/1272* (2013.01); *H01G 4/33* (2013.01); *H01L 23/5223* (2013.01); *H01L 28/91* (2013.01)

(58) Field of Classification Search
CPC ....... H01G 4/06; H01G 4/005; H01L 23/5223
USPC ...................................................... 361/301.4
See application file for complete search history.

(56) References Cited

U.S. PATENT DOCUMENTS

| | | | |
|---|---|---|---|
| 6,593,185 B1 | 7/2003 | Tsai et al. | |
| 2009/0065836 A1* | 3/2009 | Kim | .............. H01L 23/5223 257/296 |
| 2017/0330931 A1* | 11/2017 | Cheng | .............. H01L 28/75 |
| 2018/0083588 A1* | 3/2018 | Yun | .............. H01G 4/005 |

* cited by examiner

*Primary Examiner* — Michael P McFadden
(74) *Attorney, Agent, or Firm* — Jiawei Huang

(57) ABSTRACT

A capacitor includes a first electrode, a dielectric, and a second electrode. The first electrode is located on a dielectric layer. The dielectric covers the sidewall and the top surface of the first electrode. The second electrode covers the dielectric and the dielectric layer, wherein the orthographic projection area of the second electrode on the dielectric layer is greater than the orthographic projection area of the first electrode on the dielectric layer. The capacitor of the invention has good reliability.

20 Claims, 5 Drawing Sheets

CAPACITOR AND METHOD OF FABRICATING THE SAME

CROSS REFERENCE TO RELATED APPLICATION

This application claims the priority benefits of China application serial no. 201710364072.8, filed on May 22, 2017. The entirety of the above-mentioned patent application is hereby incorporated by reference herein and made a part of specification.

BACKGROUND OF THE INVENTION

Field of the Invention

The invention relates to a semiconductor structure and a method of fabricating the same, and more particularly, to a capacitor and a method of fabricating the same.

Description of Related Art

In integrated circuits, the capacitor includes a metal-oxide semiconductor (MOS) capacitor, a PN junction capacitor, a polysilicon-insulator-polysilicon (PIP) capacitor, and a metal-insulator-metal (MIM) capacitor. Among the various capacitors exemplified, other than the MIM capacitor, the capacitors all have at least one electrode formed by single-crystal silicon or polysilicon, and when bias voltage is applied to the single-crystal silicon or polysilicon electrode, a depletion region may be formed therein, such that the operating voltage of the capacitor is unstable and capacitance is not maintained at the same standard as a result.

The MIM capacitor has a lower potential coefficient (VCC) and temperature coefficient (TCC), and is therefore extensively applied in integrated circuits. However, as the size of semiconductor devices continues to become smaller, how to increase the reliability of the MIM capacitor to provide greater breakdown voltage (BVD) and longer time-dependent dielectric breakdown (TDDB) is an important issue researchers need to solve.

SUMMARY OF THE INVENTION

The invention provides a capacitor having good reliability and a method of fabricating the same.

An embodiment of the invention provides a capacitor including a first electrode, a dielectric, and a second electrode. The first electrode is located on a dielectric layer. The dielectric covers the sidewall and the top surface of the first electrode. The second electrode covers the dielectric and the dielectric layer, wherein the orthographic projection area of the second electrode on the dielectric layer is greater than the orthographic projection area of the first electrode on the dielectric layer.

In an embodiment of the invention, a first conductive layer and a second conductive layer are further included, and the first conductive layer and the second conductive layer are respectively located at two opposite sides of the dielectric layer, wherein the first conductive layer and the second conductive layer are respectively electrically connected to the first electrode and the second electrode.

In an embodiment of the invention, the first electrode or the second electrode is an M-th conductive layer, the first conductive layer is an (M−1)th conductive layer, and the second conductive layer is an (M+1)th conductive layer, wherein M≥2.

In an embodiment of the invention, a first via and a second via are further included, wherein the first via is located on the second electrode and is electrically connected to the second conductive layer and the second electrode, and the second via is located in the dielectric layer and is electrically connected to the first conductive layer and the first electrode.

In an embodiment of the invention, the orthographic projection area of the second electrode on the dielectric layer is greater than the orthographic projection area of the dielectric on the dielectric layer.

Another embodiment of the invention provides a capacitor including a first electrode, a dielectric, a second electrode, and a first via. The first electrode is located on a dielectric layer. The dielectric covers the sidewall and the top surface of the first electrode. The second electrode covers the dielectric and the dielectric layer. The first via is electrically connected to the second electrode, and the first via is located on a portion of the second electrode not overlapped with the first electrode.

In an embodiment of the invention, the first via is not overlapped with the dielectric.

In an embodiment of the invention, the dielectric is further located on a portion of the surface of the dielectric layer.

In an embodiment of the invention, a second via is further included, wherein the second via is located in the dielectric layer and electrically connected to the first electrode.

In an embodiment of the invention, a first conductive layer and a second conductive layer are further included, and the first conductive layer and the second conductive layer are respectively located at two opposite sides of the dielectric layer, wherein the first conductive layer and the second conductive layer are respectively electrically connected to the second via and the first via.

In an embodiment of the invention, the first electrode or the second electrode is an M-th conductive layer, the first conductive layer is an (M−1)th conductive layer, and the second conductive layer is an (M+1)th conductive layer, wherein M≥2.

In an embodiment of the invention, the thickness range of the first electrode is 500 Å to 1000 Å.

An embodiment of the invention provides a method of fabricating a capacitor including the following steps. A first electrode material layer is formed on the dielectric layer. The first electrode material layer is patterned to form a first electrode. The dielectric layer and the first electrode are covered with a dielectric material. The dielectric material is patterned to form a dielectric on the top surface and the sidewall of the first electrode. The dielectric is covered with a second electrode.

In an embodiment of the invention, after the dielectric is covered with the second electrode, a first via is further formed on the second electrode.

In an embodiment of the invention, the first via is located on a portion of the second electrode not overlapped with the first electrode.

In an embodiment of the invention, the first via is not overlapped with the dielectric.

In an embodiment of the invention, before the first electrode material is formed on the dielectric layer, a second via is further formed in the dielectric layer, wherein the second via is electrically connected to the first electrode.

In an embodiment of the invention, the following steps are further included. A first conductive layer is formed before the dielectric layer is formed. After the first via is formed, a second conductive layer is formed, wherein the first conductive layer is electrically connected to the first electrode, and the second conductive layer is electrically connected to the second electrode.

In an embodiment of the invention, the first electrode or the second electrode is an M-th conductive layer, the first conductive layer is an (M−1)th conductive layer, and the second conductive layer is an (M+1)th conductive layer, wherein M≥2 and the (M+1)th conductive layer is a top layer.

In an embodiment of the invention, the method of forming the second electrode includes the following steps. A second electrode material layer is formed on the dielectric and the dielectric layer. The second electrode material layer is patterned using the dielectric layer as an etch stop layer to cover the dielectric with the second electrode.

Based on the above, in the capacitor and the method of fabricating the same provided in the embodiments of the invention, since the orthographic projection area of the second electrode on the dielectric layer is greater than the orthographic projection area of the first electrode on the dielectric layer, in the process of forming the second electrode on the dielectric, the dielectric is not damaged from the influence of the patterning process, and therefore the reliability of the capacitor is increased. Moreover, in the capacitor and the method of fabricating the same provided by the embodiments of the invention, the first via is further disposed on a portion of the second electrode not overlapped with the first electrode to prevent the dielectric from directly bearing the denser electric lines formed directly below the first via, such that the capacitor is not readily burned and the reliability of the capacitor is increased as a result.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
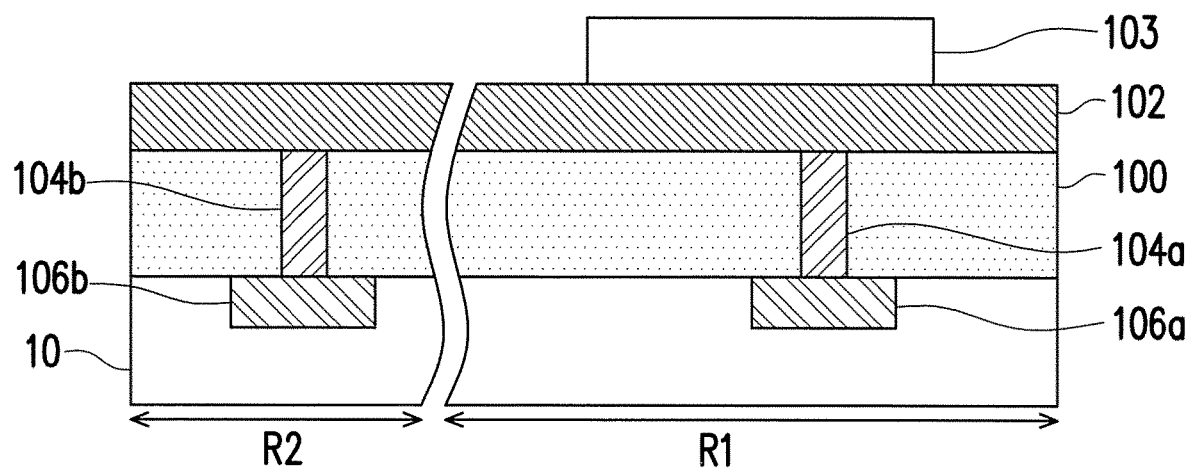
FIG. 1A to FIG. 1H are cross sections of a method of fabricating the capacitor according to an embodiment of the invention.

The invention is more comprehensively described with reference to the figures of the present embodiments. However, the invention can also be implemented in various different forms, and is not limited to the embodiments in the present specification. The thicknesses of the layers and regions in the figures are enlarged for clarity. The same or similar reference numerals represent the same or similar devices and are not repeated in the following paragraphs.

FIG. 1A to FIG. 1H are cross sections of a method of fabricating the capacitor according to an embodiment of the invention. FIG. 2 is a top view of a capacitor according to an embodiment of the invention and omits the dielectric layer and the second conductive layer located on the second electrode to clearly show the relative positions of the first electrode, the dielectric, the second electrode, and the first via.

Figure 2:
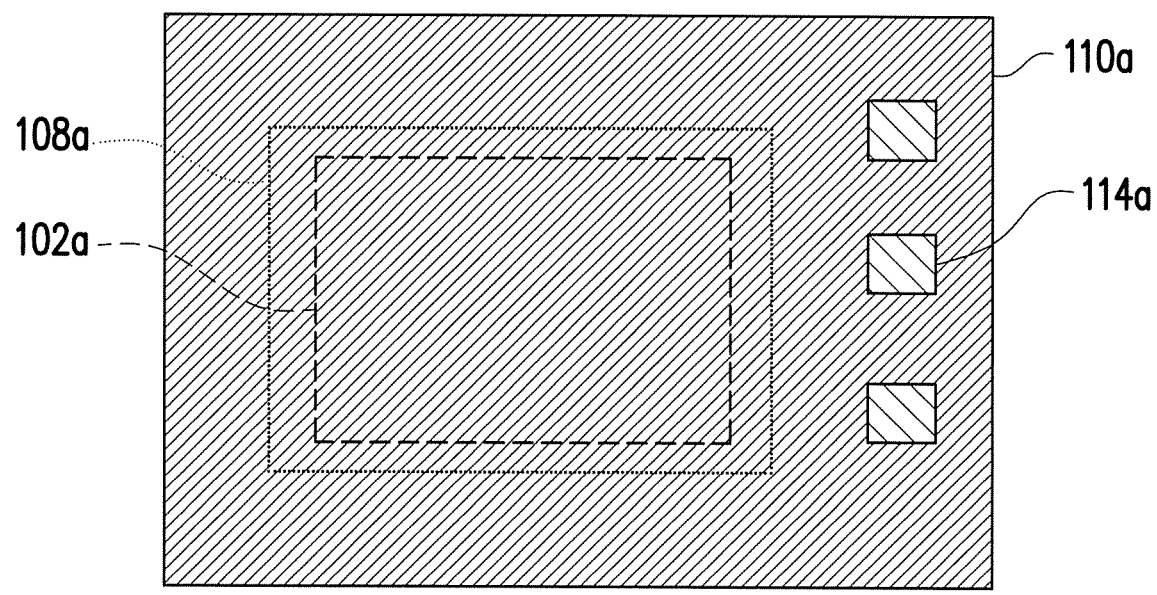
FIG. 2 is a top view of a capacitor according to an embodiment of the invention.

Referring to FIG. 1A, a substrate 10 is provided. The substrate 10 includes a capacitance region R1 and a non-capacitance region R2. The non-capacitance region R2 is, for instance, a logic circuit region or a memory cell region. The substrate 10 includes a semiconductor substrate. The semiconductor substrate is, for instance, a doped silicon substrate, an undoped silicon substrate, or a semiconductor-on-insulator (SOI) substrate. The doped silicon substrate is P-type doped, N-type doped, or a combination thereof. In some embodiments, the substrate 10 further includes an inner dielectric layer (ILD) and/or a contact, but the invention is not limited thereto. In some other embodiments, the substrate 10 includes an inner dielectric layer and/or a contact, and further includes a conductive layer and/or a via of an inter-metal dielectric (IMD) or a plurality of metal interconnects.

The substrate 10 has a first conductive layer 106a and a conductive layer 106b. The first conductive layer 106a is located in the capacitance region R1, and the conductive layer 106b is located in the non-capacitance region R2. The first conductive layer 106a and the conductive layer 106b are, for instance, metal, metal alloy, metal nitride, metal silicide, or a combination thereof. In some exemplary embodiments, the metal and metal alloy are, for instance, copper (Cu), aluminum (Al), titanium (Ti), tantalum (Ta), tungsten (W), platinum (Pt), chromium (Cr), molybdenum (Mo), or an alloy thereof. The metal nitride is, for instance, titanium nitride, tungsten nitride, tantalum nitride, tantalum silicon nitride (TaSiN), titanium silicon nitride (TiSiN), tungsten silicon nitride (WSiN), or a combination thereof. The metal silicide is, for instance, tungsten silicide, titanium silicide, cobalt silicide, chromium silicide, platinum silicide, molybdenum silicide, copper silicide, nickel silicide, or a combination thereof. The first conductive layer 106a and the conductive layer 106b are formed by, for instance, atomic layer deposition (ALD), chemical vapor deposition (CVD), physical vapor deposition (PVD), or a combination thereof. In some embodiments, the first conductive layer 106a and the conductive layer 106b are one of a plurality of conductive layers of a multilevel interconnect. For instance, the first conductive layer 106a and the conductive layer 106b are the (M−1)th conductive layers (or metal layers) of the multilevel interconnect, wherein M≥2 and the first conductive layer 106a and the conductive layer 106b are not the topmost conductive layer of the multilevel interconnect. In some other embodiments, the first conductive layer 106a and the conductive layer 106b can also not be one of the plurality of conductive layers of the multilevel interconnect.

Referring further to FIG. 1A, a dielectric layer 100 is formed on the substrate 10, the first conductive layer 106a, and the conductive layer 106b. The dielectric layer 100 is, for instance, an inter-metal dielectric (IMD). The material of the dielectric layer 100 is, for instance, a dielectric material. The dielectric material is, for instance, silicon oxide, tetraethoxysilane (TEOS), silicon oxide, silicon nitride, silicon oxynitride, undoped silicon glass (USG), borophosphosilicate glass (BPSG), phosphosilicate glass (PSG), a low-k material having a dielectric constant less than 4, or a combination thereof. The low-k material is, for instance, fluorosilicate glass (FSG), silicon sesquioxide, aromatic hydrocarbon, organosilicate glass, parylene, fluoro-polymer, poly(arylether), porous polymer, or a combination thereof. The silsesquioxnane is, for instance, hydrogen silsesquioxnane (HSQ), methyl silsesquioxane (MSQ), or hybrido-organosiloxane polymer (HOSP). The aromatic hydrocarbon is, for instance, SiLK. The organosilicate glass is, for instance, carbon black (black diamond, BD), 3 MS, or 4 MS.

The fluorinated polymer is, for instance, PFCB, CYTOP, or Teflon. The polyarylether is, for instance, PAE-2 or FLARE. The porous polymer is, for instance, XLK, nanofoam, aerogel, or coral. The dielectric layer 100 is formed by, for instance, ALD, CVD, SOG, or a combination thereof.

Then, a via 104a and a via 104b are formed in the dielectric layer 100. The via 104a (also referred to as second via) is located in the capacitance region R1 and electrically connected to the first conductive layer 106a. The via 104b is located in the non-capacitance region R2 and electrically connected to the conductive layer 106b. The material of the vias 104a and 104b is, for instance, a conductive material. The conductive material is, for instance, metal, metal alloy, metal nitride, metal silicide, or a combination thereof. In some exemplary embodiments, the metal and metal alloy are, for instance, Cu, Al, Ti, Ta, W, Pt, Cr, Mo, or an alloy thereof. The metal nitride is, for instance, titanium nitride, tungsten nitride, tantalum nitride, tantalum silicon nitride (TaSiN), titanium silicon nitride (TiSiN), tungsten silicon nitride (WSiN), or a combination thereof. The metal silicide is, for instance, tungsten silicide, titanium silicide, cobalt silicide, chromium silicide, platinum silicide, molybdenum silicide, copper silicide, nickel silicide, or a combination thereof. The conductive material is formed by, for instance, ALD, CVD, PVD, or a combination thereof. The forming method of the vias 104a and 104b includes, for instance, forming a plurality of via holes in the dielectric layer 100 via a lithography and etching process, and the via holes respectively expose a portion of the first conductive layer 106a and the conductive layer 106b corresponding to each other, and then a conductive material is filled in the plurality of via holes.

Referring further to FIG. 1A, a first electrode material layer 102 is formed on the dielectric layer 100. The material of the first electrode material layer 102 is, for instance, a conductive material. The conductive material is, for instance, metal, metal alloy, metal nitride, metal silicide, or a combination thereof. In some exemplary embodiments, the metal and metal alloy are, for instance, Cu, Al, Ti, Ta, W, Pt, Cr, Mo, or an alloy thereof. The metal nitride is, for instance, titanium nitride, tungsten nitride, tantalum nitride, tantalum silicon nitride (TaSiN), titanium silicon nitride (TiSiN), tungsten silicon nitride (WSiN), or a combination thereof. The metal silicide is, for instance, tungsten silicide, titanium silicide, cobalt silicide, chromium silicide, platinum silicide, molybdenum silicide, copper silicide, nickel silicide, or a combination thereof. The first electrode material layer 102 is formed by, for instance, ALD, CVD, PVD, or a combination thereof.

Figure 1B:
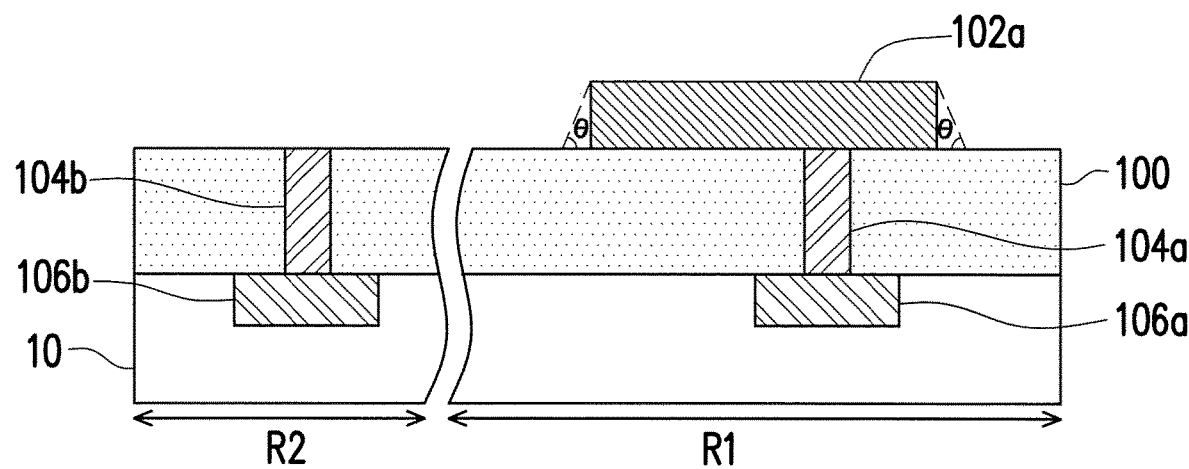

Referring to both FIG. 1A and FIG. 1B, the first electrode material layer 102 is patterned to form a first electrode 102a on the dielectric layer 100 of the capacitance region R1. The first electrode 102a is electrically connected to the first conductive layer 106a via the via 104a (i.e., the second via). In some embodiments, the method of patterning the first electrode material layer 102 includes forming a patterned photoresist layer 103 on the first electrode material layer 102. Next, the first electrode material layer 102 exposed by the patterned photoresist layer 103 is removed to form the first electrode 102a. Next, the patterned photoresist layer 103 is removed. The method of removing the first electrode material layer 102 exposed by the patterned photoresist layer 103 includes etching, such as dry etching, wet etching, or a combination thereof. The method of removing the patterned photoresist layer includes, for instance, an ashing process. In some embodiments, the thickness range of the first electrode 102a is 500 Å to 1000 Å. Since the thickness of the first electrode 102a is relatively small, the surface roughness is smaller (i.e., the surface is smooth), such that a dielectric 108a formed subsequently above the first electrode 102a does not have portions with too smaller thickness caused by a rough surface of the first electrode 102a resulting in reduced breakdown voltage of the capacitor. In some embodiments, the sidewall of the first electrode 102a has a taper (as shown by the dotted line). For instance, the angle θ between the sidewall of the first electrode 102a and the surface of the dielectric layer 100 is less than 90 degrees. As a result, in a subsequent process, the dielectric material layer 108 covers the sidewall and the top surface well of the first electrode 102a well (i.e., step coverage is good) to prevent poor step coverage from affecting the breakdown voltage of the capacitor.

In some embodiments, the first electrode 102a is not one of the plurality of conductive layers of the multilevel interconnect. In some other embodiments, the first electrode 102a may also be one of the plurality of conductive layers of the multilevel interconnect. For instance, when the first conductive layer 106a and the conductive layer 106b are the (M−1)th conductive layers of the multilevel interconnect, the first electrode 102a is the M-th conductive layer (or metal layer) of the multilevel interconnect, and the first electrode 102a is not the topmost conductive layer of the multilevel interconnect.

Figure 1C:
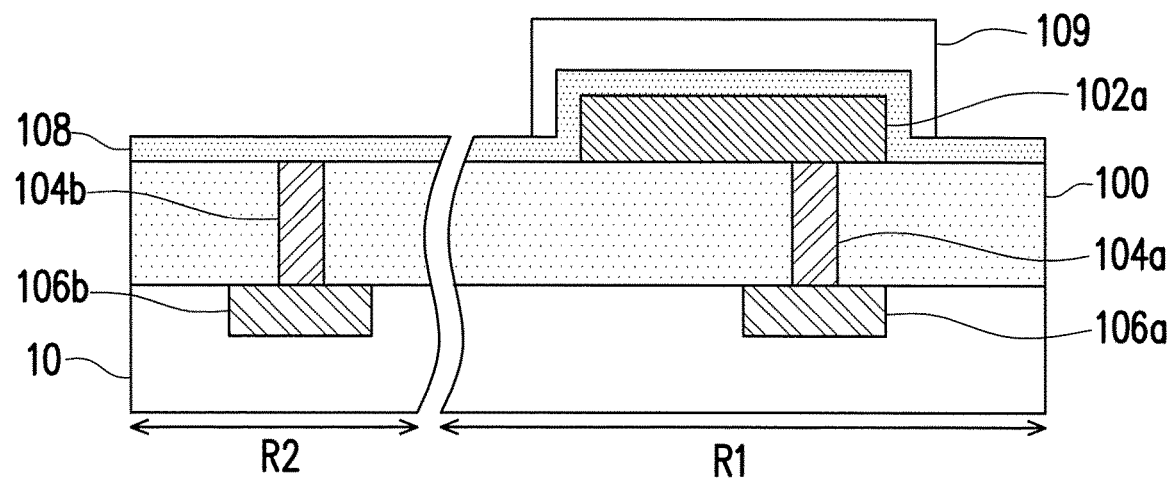

Referring to FIG. 1C, the dielectric layer 100 and the first electrode 102a are covered with the dielectric material layer 108. In some embodiments, the dielectric material layer 108 is conformally formed on the dielectric layer 100 and the first electrode 102a. The material of the dielectric material layer 108 is, for instance, an oxide, nitride, oxynitride, or high-k material. In some exemplary embodiments, the material of the dielectric material layer 108 is silicon oxide, silicon nitride, silicon oxynitride, oxide-nitride-oxide (ONO), a high-k material having a dielectric constant greater than 4, greater than 7, or even greater than 10, or a combination thereof. The high-k material is, for instance, a metal oxide. For instance, the metal oxide is a rare earth metal oxide such as hafnium oxide ($HfO_2$), hafnium silicon oxide (HfSiO), hafnium silicon oxynitride (HfSiON), aluminum oxide ($Al_2O_3$), yttrium oxide ($Y_2O_3$), lanthanum oxide ($La_2O_3$), lanthanum aluminum oxide (LaAlO), tantalum oxide ($Ta_2O_5$), zirconium oxide ($ZrO_2$), zirconium silicon oxide ($ZrSiO_4$), hafnium zirconium oxide (HfZrO), strontium bismuth tantalate ($SrBi_2Ta_2O_9$(SBT)), or a combination thereof. The dielectric material layer 108 is formed by, for instance, ALD, CVD, or a combination thereof.

Figure 1D:
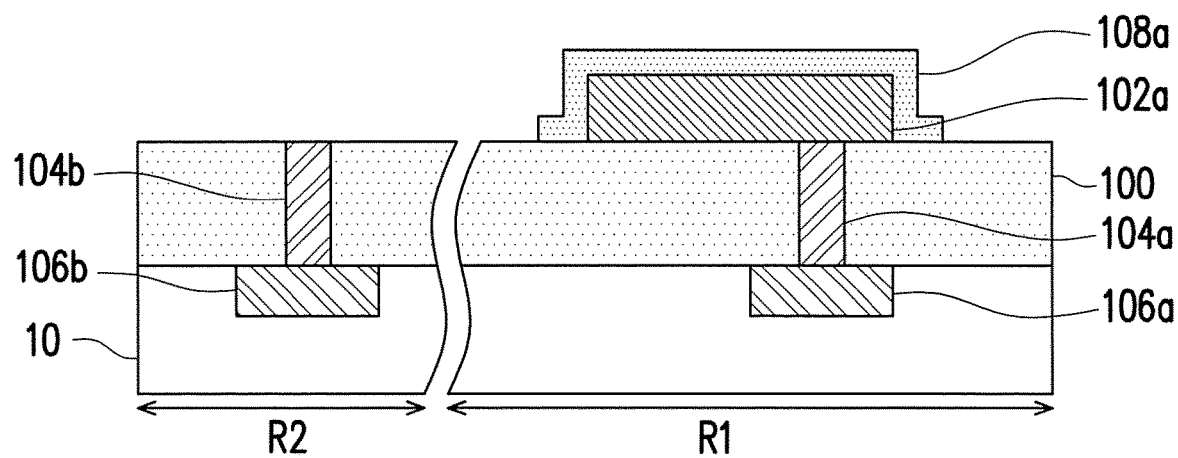

Referring to both FIG. 1C and FIG. 1D, the dielectric material layer 108 is patterned to form the dielectric 108a. The dielectric 108a at least covers the top surface and the sidewall of the first electrode 102a. In some embodiments, in addition to covering the top surface and the sidewall of the first electrode 102a, the dielectric 108a is also extended to cover a portion of the surface of the dielectric layer 100 (as shown in FIG. 1D). In some embodiments, the method of patterning the dielectric material layer 108 includes forming a patterned photoresist layer 109 on the dielectric material layer 108. Next, the dielectric material layer 108 (such as the first electrode material layer 102 located in the non-capacitance region R2) exposed by the patterned photoresist layer 109 is removed to form the dielectric 108a. Next, the patterned photoresist layer 109 is removed. The method of removing the dielectric material layer 108 exposed by the patterned photoresist layer 109 includes etching, such as dry etching, wet etching, or a combination thereof. The method of removing the patterned photoresist layer 109 is, for instance, an ashing process.

Figure 1E:
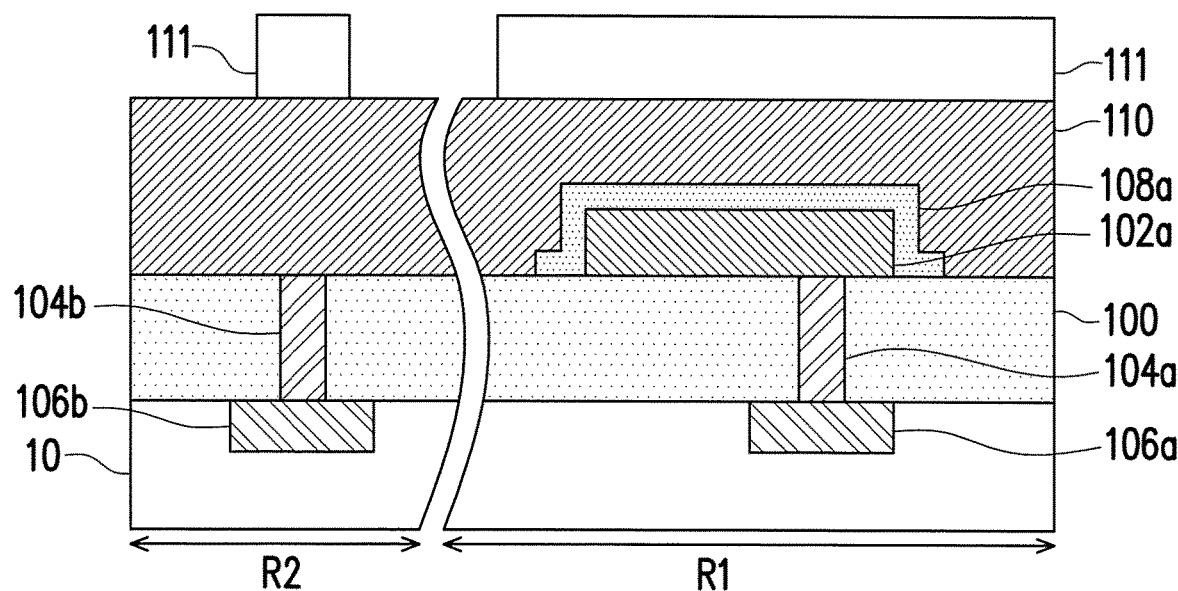

Referring to FIG. 1E, a second electrode material layer 110 is formed on the dielectric 108a and the dielectric layer 100. The material of the second electrode material layer 110 is, for instance, a conductive material. The conductive material is, for instance, metal, metal alloy, metal nitride, metal silicide, or a combination thereof. In some exemplary embodiments, the metal and metal alloy are, for instance, Cu, Al, Ti, Ta, W, Pt, Cr, Mo, or an alloy thereof. The metal nitride is, for instance, titanium nitride, tungsten nitride, tantalum nitride, tantalum silicon nitride (TaSiN), titanium silicon nitride (TiSiN), tungsten silicon nitride (WSiN), or a combination thereof. The metal silicide is, for instance, tungsten silicide, titanium silicide, cobalt silicide, chromium silicide, platinum silicide, molybdenum silicide, copper silicide, nickel silicide, or a combination thereof. The second electrode material layer 110 is formed by, for instance, ALD, CVD, PVD, or a combination thereof. In some embodiments, the second electrode material layer 110 is a multilayer structure. For instance, from the bottom to the top (i.e., in the direction from adjacent to the dielectric 108a to away from the dielectric 108a), the second electrode material layer 110 includes a glue layer, a metal layer, and an anti-reflective coating (ARC) in order. The glue layer increases the adhesion between the metal layer and the dielectric 108a, and the material thereof is, for instance, titanium, titanium nitride, tantalum, tantalum nitride, or a combination thereof. The material of the metal layer is, for instance, A1. The ARC reduces the generation of reflected light, and therefore in a subsequent process of patterning the second electrode material layer 110, the resolution of the patterned photoresist 111 formed on the second electrode material layer 110 is not reduced from the reflection during exposure. The material of the ARC is, for instance, titanium, titanium nitride, or a combination thereof.

Figure 1F:
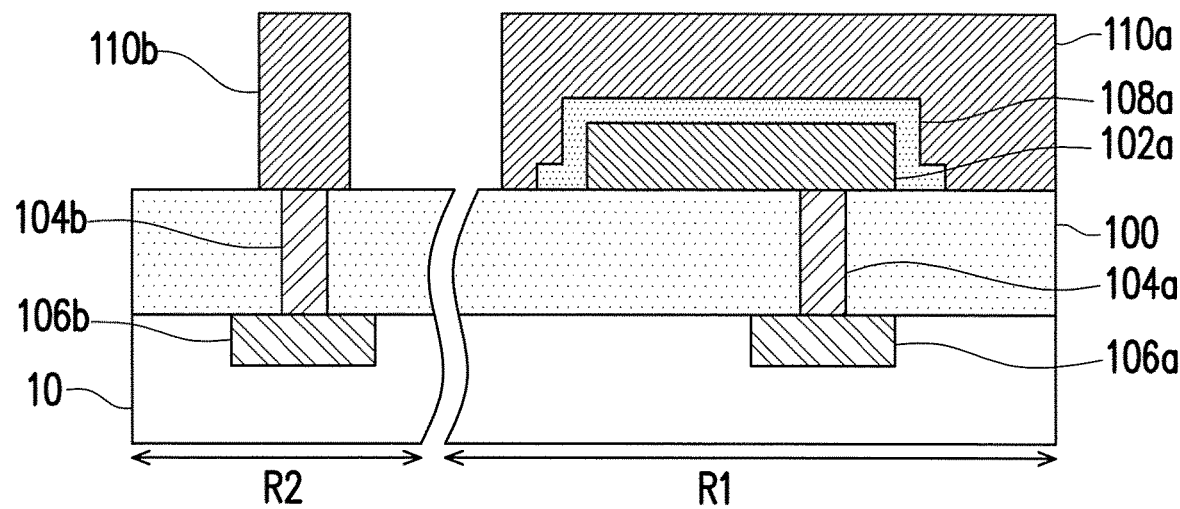

Referring to both FIG. 1E and FIG. 1F, the second electrode material layer 110 is patterned to respectively form a second electrode 110a in the capacitance region R1 and form a conductive layer 110b in the non-capacitance region R2. For instance, the method of patterning the second electrode material layer 110 to form the second electrode 110a includes first forming the patterned photoresist layer 111 on the second electrode material layer 110. Next, an etching process is performed by using the dielectric layer 100 as an etch stop layer to remove the second electrode material layer 110 exposed by the patterned photoresist layer 111. Next, the patterned photoresist layer 111 is removed. The method of removing the second electrode material layer 110 exposed by the patterned photoresist layer 111 includes etching, such as dry etching, wet etching, or a combination thereof. The method of removing the patterned photoresist layer 111 is, for instance, an ashing process.

Referring to FIG. 1F and FIG. 2, in some embodiments, the second electrode 110a covers the dielectric 108a and a portion of the dielectric layer 100 such that the orthographic projection area of the second electrode 110a on the dielectric layer 100 is greater than the orthographic projection area of the first electrode 102a on the dielectric layer 100 (as shown in FIG. 2). In some other embodiments, the orthographic projection area of the second electrode 110a on the dielectric layer 100 is further greater than the orthographic projection area of the dielectric 108a on the dielectric layer 100 (as shown in FIG. 2). Therefore, in the etching process of removing the second electrode material layer 110 exposed by the patterned photoresist layer 111, the dielectric layer 100 is used as an etch stop layer, and the dielectric 108a is not used as the etch stop layer, and therefore the dielectric 108a is not damaged from the etching process in the patterning process of the second electrode material layer 110, such that the reliability of the capacitor is increased.

Moreover, in some embodiments, the dielectric 108a is extended to cover a portion of the surface of the dielectric layer 100. In the etching process of patterning the second electrode material layer 110, even if the dielectric 108a extended to cover a portion of the surface of the dielectric layer 100 (the dielectric 108a covering portions other than the top surface and the sidewall of the first electrode 102a) is used as the etch stop layer, since the dielectric 108a in this portion is not an effective dielectric (not located between the second electrode 110a and the first electrode 102a), the reliability of the capacitor is not compromised.

Moreover, in some embodiments, the second electrode 110a can also be one of the plurality of conductive layers of the multilevel interconnect. For instance, when the first conductive layer 106a and the conductive layer 106b are the (M−1)th conductive layers of the multilevel interconnect, the second electrode 110a is the M-th conductive layer of the multilevel interconnect, and the second electrode 110a is not the topmost conductive layer of the multilevel interconnect. In other words, in some embodiments, the second electrode 110a or the first electrode 102a is the M-th conductive layer of the multilevel interconnect. In some other embodiments, the second electrode 110a is not one of the plurality of conductive layers of the multilevel interconnect.

Figure 1G:
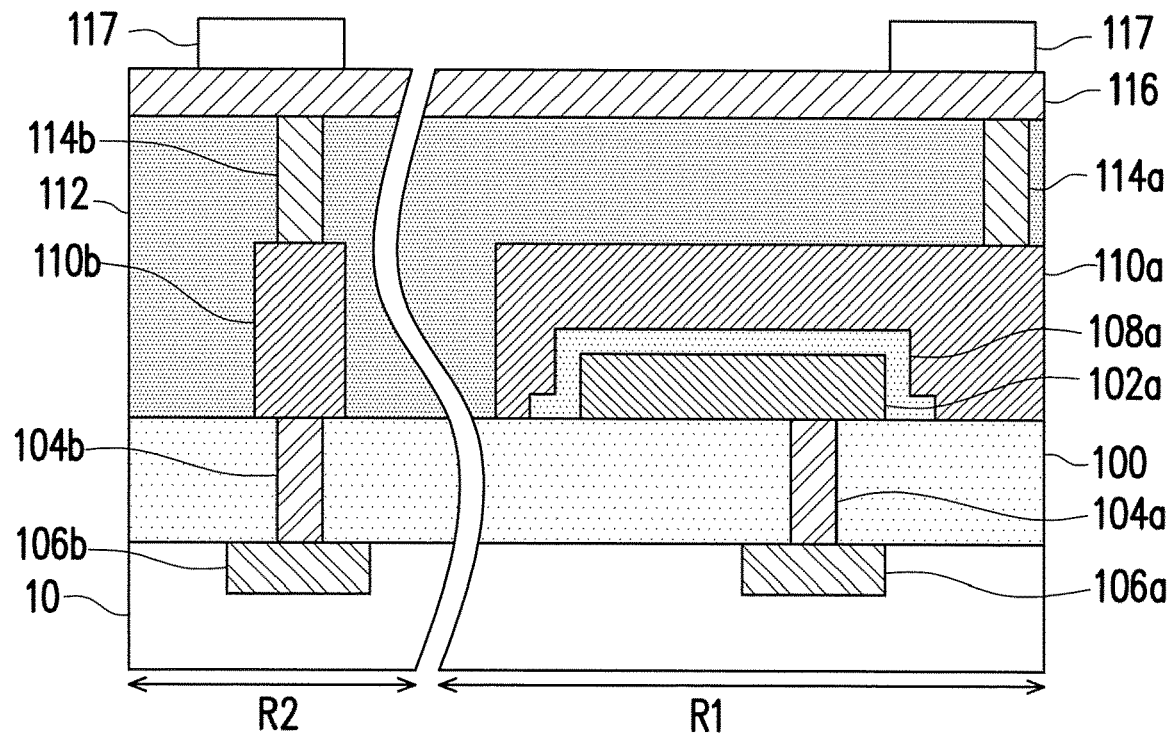

Referring to FIG. 1G, the dielectric layer 100 and the second electrode 110a are covered with a dielectric layer 112. The material of the dielectric layer 112 is, for instance, a dielectric material. The dielectric material is, for instance, silicon oxide, tetraethoxysilane (TEOS), silicon oxide, silicon nitride, silicon oxynitride, undoped silicon glass (USG), borophosphosilicate glass (BPSG), phosphosilicate glass (PSG), a low-k material having a dielectric constant less than 4, or a combination thereof. The low-k material is, for instance, fluorosilicate glass (FSG), silicon sesquioxide, aromatic hydrocarbon, organosilicate glass, parylene, fluoro-polymer, poly(arylether), porous polymer, or a combination thereof. The silsesquioxnane is, for instance, hydrogen silsesquioxane (HSQ), methyl silsesquioxane (MSQ), or hybrido-organosiloxane polymer (HOSP). The aromatic hydrocarbon is, for instance, SiLK. The organosilicate glass is, for instance, carbon black (black diamond, BD), 3 MS, or 4 MS. The fluorinated polymer is, for instance, PFCB, CYTOP, or Teflon. The polyarylether is, for instance, PAE-2 or FLARE. The porous polymer is, for instance, XLK, nanofoam, aerogel, or coral. The dielectric layer 112 is formed by, for instance, ALD, CVD, SOG, or a combination thereof.

Then, a via 114a and a via 114b are formed in the dielectric layer 112. The via 114a (also referred to as first via) is located in the capacitance region R1 and electrically connected to the second electrode 110a. The via 114b is located in the non-capacitance region R2 and electrically connected to the conductive layer 110b. The material of the vias 114a and 114b is, for instance, a conductive material. The conductive material is, for instance, metal, metal alloy, metal nitride, metal silicide, or a combination thereof. In some exemplary embodiments, the metal and metal alloy are, for instance, Cu, Al, Ti, Ta, W, Pt, Cr, Mo, or an alloy thereof. The metal nitride is, for instance, titanium nitride, tungsten nitride, tantalum nitride, tantalum silicon nitride (TaSiN), titanium silicon nitride (TiSiN), tungsten silicon nitride (WSiN), or a combination thereof. The metal silicide is, for instance, tungsten silicide, titanium silicide, cobalt silicide, chromium silicide, platinum silicide, molybdenum silicide, copper silicide, nickel silicide, or a combination thereof. The forming method of the vias 114a and 114b includes, for instance, forming a plurality of via holes in the dielectric layer 112 via a lithography and etching process, and the via holes respectively expose a portion of the second electrode 110a and a portion of the conductive layer 110b corresponding to each other, and then a conductive material is filled in the plurality of via holes.

As shown in FIG. 2, in some embodiments, the via 114a (i.e., the first via) is located on a portion of the second electrode 110a not overlapped with the first electrode 102a. In some other embodiments, the via 114a is located on a portion of the second electrode 110a not overlapped with the first electrode 102a and the dielectric 108a. As a result, when voltage is applied to the via 114, the dielectric 108a covering the top surface of the first electrode 102a is prevented from directly bearing the denser electric lines formed directly below the first via 114a, such that the capacitor is not readily burned and the reliability of the capacitor is increased as a result.

Moreover, referring to FIG. 1H, since the first electrode 102a is connected to an external circuit via the via 104a (i.e., the second via) and the first conductive layer 106a formed first below the first electrode 102a, a via passing through the dielectric layer 112 and the dielectric 108a does not need to be formed to connect the first electrode 102a. Therefore, damage to the dielectric 108a and the reduced breakdown voltage of the capacitor are prevented as a result. More specifically, if a via connected to the first electrode 102a is to be formed in the dielectric layer 112 and the via 108a, then the second electrode 110a needs to be first patterned before the dielectric layer 112 is formed to form an opening exposing the dielectric 108a in the second electrode 110a. However, in the etching process of patterning the second electrode 110a, the dielectric 108a is used as the etch stop layer. To ensure the opening exposes the dielectric 108a, the dielectric 108a is generally over-etched. However, the dielectric 108a is damaged (such as reduced thickness) by over-etching, and the damaged portion causes reduced breakdown voltage of the capacitor due to fringe field effect.

Referring further to FIG. 1G, a second conductive material layer 116 is formed on the dielectric layer 112. The second conductive material layer 116 is, for instance, metal, metal alloy, metal nitride, metal silicide, or a combination thereof. In some exemplary embodiments, the metal and metal alloy are, for instance, Cu, Al, Ti, Ta, W, Pt, Cr, Mo, or an alloy thereof. The metal nitride is, for instance, titanium nitride, tungsten nitride, tantalum nitride, tantalum silicon nitride (TaSiN), titanium silicon nitride (TiSiN), tungsten silicon nitride (WSiN), or a combination thereof. The metal silicide is, for instance, tungsten silicide, titanium silicide, cobalt silicide, chromium silicide, platinum silicide, molybdenum silicide, copper silicide, nickel silicide, or a combination thereof. The second conductive material layer 116 is formed by, for instance, ALD, CVD, PVD, or a combination thereof.

Figure 1H:
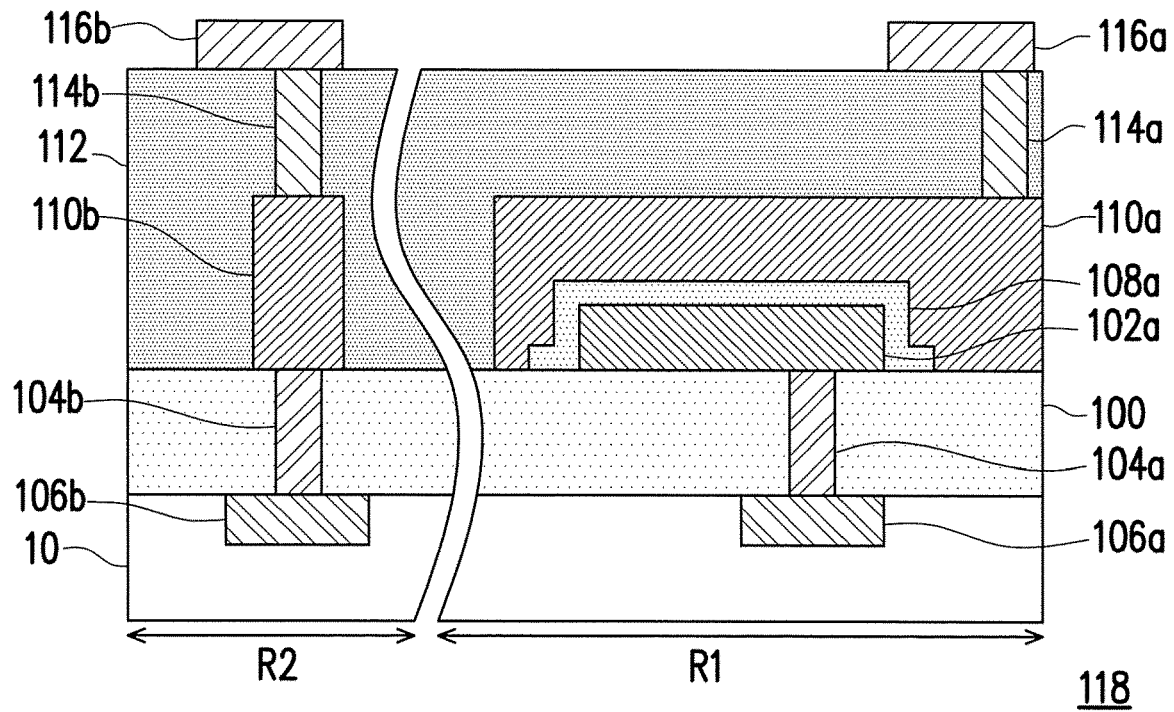

Referring to FIG. 1G and FIG. 1H, the second conductive material layer 116 is patterned to form a second conductive layer 116a and a conductive layer 116b on the dielectric layer 112. The second conductive layer 116a is located in the capacitance region R1 and electrically connected to the second electrode 110a via the via 114a. The conductive layer 116b is located in the non-capacitance region R2 and electrically connected to the conductive layer 110b via the via 114b. In some embodiments, the method of patterning the second conductive material layer 116 to form the second conductive layer 116a and the conductive layer 116b includes first forming a patterned photoresist layer 117 on the second conductive material layer 116. Next, the second conductive material layer 116 exposed by the patterned photoresist layer 117 is removed. Next, the patterned photoresist layer 117 is removed. The method of removing the second conductive material layer 116 exposed by the patterned photoresist layer 117 includes etching, such as dry etching, wet etching, or a combination thereof. The method of removing the patterned photoresist layer 117 is, for instance, an ashing process.

In some embodiments, the second conductive layer 116a and the conductive layer 116b can also be one of the plurality of conductive layers of the multilevel interconnect. For instance, when the first conductive layer 106a and the conductive layer 106b are the (M−1)th conductive layers of the multilevel interconnect and the first electrode 102a or the second electrode 110a is the M-th conductive layer of the multilevel interconnect, the second conductive layer 116a and the conductive layer 116b are the (M+1)th conductive layers (or metal layers) of the multilevel interconnect, wherein M≥2. In some embodiments, the (M+1)th conductive layer of the multilevel interconnect is the topmost conductive layer. In some embodiments, the second conductive layer 116a and the conductive layer 116b are not one of the plurality of conductive layers of the multilevel interconnect.

Referring to both FIG. 1H and FIG. 2, a capacitor 118 includes a first electrode 102a, a dielectric 108a, and a second electrode 110a. The first electrode 102a is located on a dielectric layer 100. The dielectric 108a covers the sidewall and the top surface of the first electrode 102a. The second electrode 110a covers the dielectric 108a and the dielectric layer 110. The orthographic projection area of the second electrode 110a on the dielectric layer 100 is greater than the orthographic projection area of the first electrode 102a on the dielectric layer 100. In some embodiments, the orthographic projection area of the second electrode 110a on the dielectric layer 100 is further greater than the orthographic projection area of the dielectric 108a on the dielectric layer 100. Moreover, in an embodiment, the capacitor 118 further includes a via 114a (i.e., the first via) located on a portion of the second electrode 110a not overlapped with the first electrode 102a and electrically connected to the second electrode 110a. In some other embodiments, the via 114a (i.e., the first via) is further located on a portion of the second electrode 110a not overlapped with the first electrode 102a and the dielectric 108a.

Moreover, in an embodiment, the capacitor 118 further includes a via 104a (i.e., the second via). The via 104a is located in the dielectric layer 100 and electrically connected to the first electrode 102a. In other words, the via 104a and the via 114a are respectively located at two opposite sides of the first electrode 102a, the dielectric 108a, and the second electrode 110a.

Moreover, in an embodiment, the capacitor 118 further includes a first conductive layer 106a and a second conductive layer 116a. The first conductive layer 106a is located in the substrate 10 and electrically connected to the first electrode 102a via the via 104a. The second conductive layer 116a is located on the dielectric layer 112 and electrically connected to the second electrode 110a via the via 114a. In other words, the first conductive layer 106a and the second conductive layer 116a are not only located at two opposite sides of the first electrode 102a, the dielectric 108a, and the second electrode 110a, but are further located at two opposite sides of the dielectric layer 100.

Based on the above, in the capacitor and the method of fabricating the same of the embodiments, since the orthographic projection area of the second electrode on the dielectric layer is greater than the orthographic projection area of the first electrode on the dielectric layer, in the process of forming the second electrode on the dielectric, the dielectric is not damaged from the influence of the patterning process, and therefore the reliability of the capacitor is increased. Moreover, in the capacitor and the method of fabricating the same provided by the embodiments, the first via is further disposed on a portion of the second electrode not overlapped with the first electrode to prevent the dielectric from directly bearing the denser electric lines formed directly below the first via, such that the capacitor is not readily burned and the reliability of the capacitor is increased as a result. Moreover, the first dielectric is further disposed on a portion of the second electrode not overlapped with the first electrode and the dielectric to further increase the reliability of the capacitor.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A capacitor, comprising:
   a first electrode located on a top surface of a dielectric layer;
   a dielectric covering a sidewall and a top surface of the first electrode; and
   a second electrode covering the dielectric and the dielectric layer, wherein an orthographic projection area of the second electrode on the dielectric layer is greater than an orthographic projection area of the first electrode on the dielectric layer, and a bottommost surface of the second electrode is in direct physical contact with the dielectric layer, wherein the bottommost surface of the second electrode is coplanar with a bottommost surface of the first electrode and a bottommost surface of the dielectric.

2. The capacitor of claim 1, further comprising a first conductive layer and a second conductive layer respectively located at two opposite sides of the dielectric layer, wherein the first conductive layer and the second conductive layer are respectively electrically connected to the first electrode and the second electrode.

3. The capacitor of claim 2, wherein the first electrode or the second electrode is an M-th conductive layer, the first conductive layer is an (M−1)th conductive layer, and the second conductive layer is an (M+1)th conductive layer, wherein M≥2.

4. The capacitor of claim 2, further comprising a first via and a second via, wherein the first via is located on the second electrode and is electrically connected to the second conductive layer and the second electrode, and the second via is located in the dielectric layer and electrically connected to the first conductive layer and the first electrode.

5. The capacitor of claim 1, wherein the orthographic projection area of the second electrode on the dielectric layer is greater than an orthographic projection area of the dielectric on the dielectric layer.

6. A capacitor, comprising:
   a first electrode located on a top surface of a dielectric layer;
   a dielectric located on and covering a sidewall and a top surface of the first electrode;
   a second electrode located on and covering the dielectric and the dielectric layer; and
   a first via electrically connected to the second electrode, and the first via is located on a portion of the second electrode not overlapped with the first electrode,
   wherein the dielectric is sandwiched between the first electrode and the second electrode,
   wherein a bottommost surface of the first electrode, a bottommost surface of the dielectric and a bottommost surface of the second electrode are coplanar with each other.

7. The capacitor of claim 6, wherein the first via is not overlapped with the dielectric.

8. The capacitor of claim 6, wherein the dielectric is further located on a portion of a surface of the dielectric layer.

9. The capacitor of claim 6, further comprising a second via located in the dielectric layer and electrically connected to the first electrode.

10. The capacitor of claim 9, further comprising a first conductive layer and a second conductive layer respectively located at two opposite sides of the dielectric layer, wherein the first conductive layer and the second conductive layer are respectively electrically connected to the second via and the first via.

11. The capacitor of claim 10, wherein the first electrode or the second electrode is an M-th conductive layer, the first conductive layer is an (M−1)th conductive layer, and the second conductive layer is an (M+1)th conductive layer, wherein M≥2.

12. The capacitor of claim 6, wherein a thickness range of the first electrode is 500 Å to 1000 Å.

13. A method of fabricating a capacitor, comprising:
   forming a first electrode material layer on a top surface of a dielectric layer;
   patterning the first electrode material layer to form a first electrode;
   covering the dielectric layer and the first electrode with a dielectric material;
   patterning the dielectric material to form a dielectric on a top surface and a sidewall of the first electrode; and
   covering the dielectric and the dielectric layer with a second electrode, wherein an orthographic projection area of the second electrode on the dielectric layer is greater than an orthographic projection area of the first electrode on the dielectric layer, and a bottommost surface of the second electrode is in direct physical contact with the dielectric layer, wherein the bottommost surface of the second electrode is coplanar with a bottommost surface of the first electrode and a bottommost surface of the dielectric.

14. The method of fabricating the capacitor of claim 13, further comprising, after covering the dielectric with the second electrode, forming a first via on the second electrode.

15. The method of fabricating the capacitor of claim 14, wherein the first via is located on a portion of the second electrode not overlapped with the first electrode.

16. The method of fabricating the capacitor of claim 15, wherein the first via is not overlapped with the dielectric.

17. The method of fabricating the capacitor of claim 14, further comprising, before the first electrode material is formed on the dielectric layer, forming a second via in the dielectric layer, wherein the second via is electrically connected to the first electrode.

18. The method of fabricating the capacitor of claim 14, further comprising:
   forming a first conductive layer before the dielectric layer is formed; and
   forming a second conductive layer after the first via is formed,
   wherein the first conductive layer is electrically connected to the first electrode, and the second conductive layer is electrically connected to the second electrode.

19. The method of fabricating the capacitor of claim 18, wherein the first electrode or the second electrode is an M-th conductive layer, the first conductive layer is an (M−1)th conductive layer, and the second conductive layer is an (M+1)th conductive layer, wherein M≥2 and the (M+1)th conductive layer is a top layer.

20. The method of fabricating the capacitor of claim 18, wherein a method of forming the second electrode comprises:
   forming a second electrode material layer on the dielectric and the dielectric layer; and
   patterning the second electrode material layer using the dielectric layer as an etch stop layer to cover the dielectric with the second electrode.

* * * * *